United States Patent
Du et al.

(10) Patent No.: US 10,423,063 B2
(45) Date of Patent: Sep. 24, 2019

(54) MASK PATTERN CORRECTION METHOD

(71) Applicants: Semiconductor Manufacturing International (Shanghai) Corporation, Shanghai (CN); Semiconductor Manufacturing International (Beijing) Corporation, Beijing (CN)

(72) Inventors: Yao Jun Du, Shanghai (CN); Liang Li, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 88 days.

(21) Appl. No.: 15/874,064

(22) Filed: Jan. 18, 2018

(65) Prior Publication Data
US 2018/0203342 A1   Jul. 19, 2018

(30) Foreign Application Priority Data

Jan. 18, 2017   (CN) .......................... 2017 1 0038509

(51) Int. Cl.
*G03F 1/36*   (2012.01)
*G03F 7/20*   (2006.01)

(52) U.S. Cl.
CPC .................. *G03F 1/36* (2013.01); *G03F 7/20* (2013.01); *G03F 7/70308* (2013.01); *G03F 7/70441* (2013.01)

(58) Field of Classification Search
CPC .......... G03F 1/36; G03F 7/20; G03F 7/70308; G03F 7/70441

USPC ....................................................... 430/5, 30
See application file for complete search history.

(56) References Cited

U.S. PATENT DOCUMENTS

| | | | | |
|---|---|---|---|---|
| 6,813,759 B2 * | 11/2004 | Liu | ......................... | G03F 1/30 378/5 |
| 8,458,628 B2 * | 6/2013 | Credendino | ............ | G03F 1/144 716/119 |
| 8,589,830 B2 * | 11/2013 | Chang | ................. | G03F 7/70425 716/53 |
| 10,031,410 B2 * | 7/2018 | Shin | ......................... | G03F 1/36 |

* cited by examiner

*Primary Examiner* — Christopher G Young
(74) *Attorney, Agent, or Firm* — Anova Law Group, PLLC

(57) ABSTRACT

A correction method for a mask pattern is provided. The method includes providing a chip pattern region including a plurality of main features, and providing first auxiliary patterns around each main feature. The method also includes performing a first optical proximity correction to correct the main features into first correction features, and providing a plurality of detection regions. Each detection region is connected to an adjacent first correction feature via the first auxiliary pattern. In addition, the method includes performing an exposure process to obtain a light intensity distribution corresponding to each detection region after performing the exposure process. Moreover, the method includes correcting the first auxiliary patterns into second auxiliary patterns based on an auxiliary pattern correction model and the light intensity distribution of each detection region. Further, the method includes performing a second optical proximity correction on the first correction features to obtain second correction features.

20 Claims, 5 Drawing Sheets

MASK PATTERN CORRECTION METHOD

CROSS-REFERENCES TO RELATED APPLICATIONS

This application claims the priority of Chinese patent application No. 201710038509.9, filed on Jan. 18, 2017, the entirety of which is incorporated herein by reference.

FIELD OF THE DISCLOSURE

The present disclosure generally relates to the field of semiconductor manufacturing and, more particularly, relates to a mask pattern correction method.

BACKGROUND

Photolithography is a key technology in semiconductor fabrication technology. Photolithography is capable of transferring a pattern from a mask to a surface of a silicon wafer to form semiconductor products that meet the design requirements. The photolithography process includes an exposure process, a development process after the exposure process, and an etching process after the development process. In the exposure process, light is irradiated onto the photoresist-coated silicon wafer through regions in the mask where light can pass through, and the photoresist undergoes chemical reactions under the irradiation of light. In the development process, a photolithographic pattern is formed by using the difference in the degree of dissolution of the exposed and unexposed photoresist in the developer, thus the mask pattern is transferred to the photoresist. In the etching process, the silicon wafer is etched based on the photolithographic pattern formed in the photoresist layer. The mask pattern is further transferred to the silicon wafer.

In the semiconductor manufacturing, as the design size continues to decrease, the design size is getting closer to the limits of a photolithography imaging system. The diffraction effect of light becomes more and more obvious, and ultimately resulting in an optical image degradation on the design pattern. The actually formed photolithographic pattern is seriously distorted from the mask pattern, and the actual pattern ultimately formed on the silicon wafer by photolithography is different from the design pattern. This phenomenon is called optical proximity effect (OPE). Sub-resolution assist features, optical proximity correction (OPC), inverse lithography technology (ILT), double patterning, self-aligned double patterning and other technical means are used to improve the photolithography resolution.

Scattering bar (SB) is one of sub-resolution assist features. The scattering bar utilizes auxiliary pattern bars provided around a main feature to improve the photolithographic quality of the main feature. The main feature is an exposable pattern, and the scattering bar is a non-exposable pattern.

However, the conventional method for providing the scattering bar cannot sufficiently determine the scattering bar in each region and improve the stability of a second auxiliary pattern at the same time. The disclosed device structures and methods are directed to solve one or more problems set forth above and other problems in the art.

BRIEF SUMMARY OF THE DISCLOSURE

One aspect of the present disclosure includes a correction method for a mask pattern. The method includes providing a chip pattern region including a plurality of main features, and providing first auxiliary patterns in the chip pattern region around each main feature. The method also includes performing a first optical proximity correction on the chip pattern region to correct the plurality of main features into first correction features, and providing a plurality of detection regions in the chip pattern region. Each detection region is connected to an adjacent first correction feature via the first auxiliary pattern. In addition, the method includes performing an exposure process on the chip pattern region to obtain a light intensity distribution corresponding to each detection region after performing the exposure process. Moreover, the method includes correcting the first auxiliary patterns into second auxiliary patterns based on an auxiliary pattern correction model and the light intensity distribution of each detection region. Further, the method includes performing a second optical proximity correction on the first correction features after obtaining the second auxiliary patterns to obtain second correction features.

Other aspects of the present disclosure can be understood by those skilled in the art in light of the description, the claims, and the drawings of the present disclosure.

DETAILED DESCRIPTION

Figure 1:
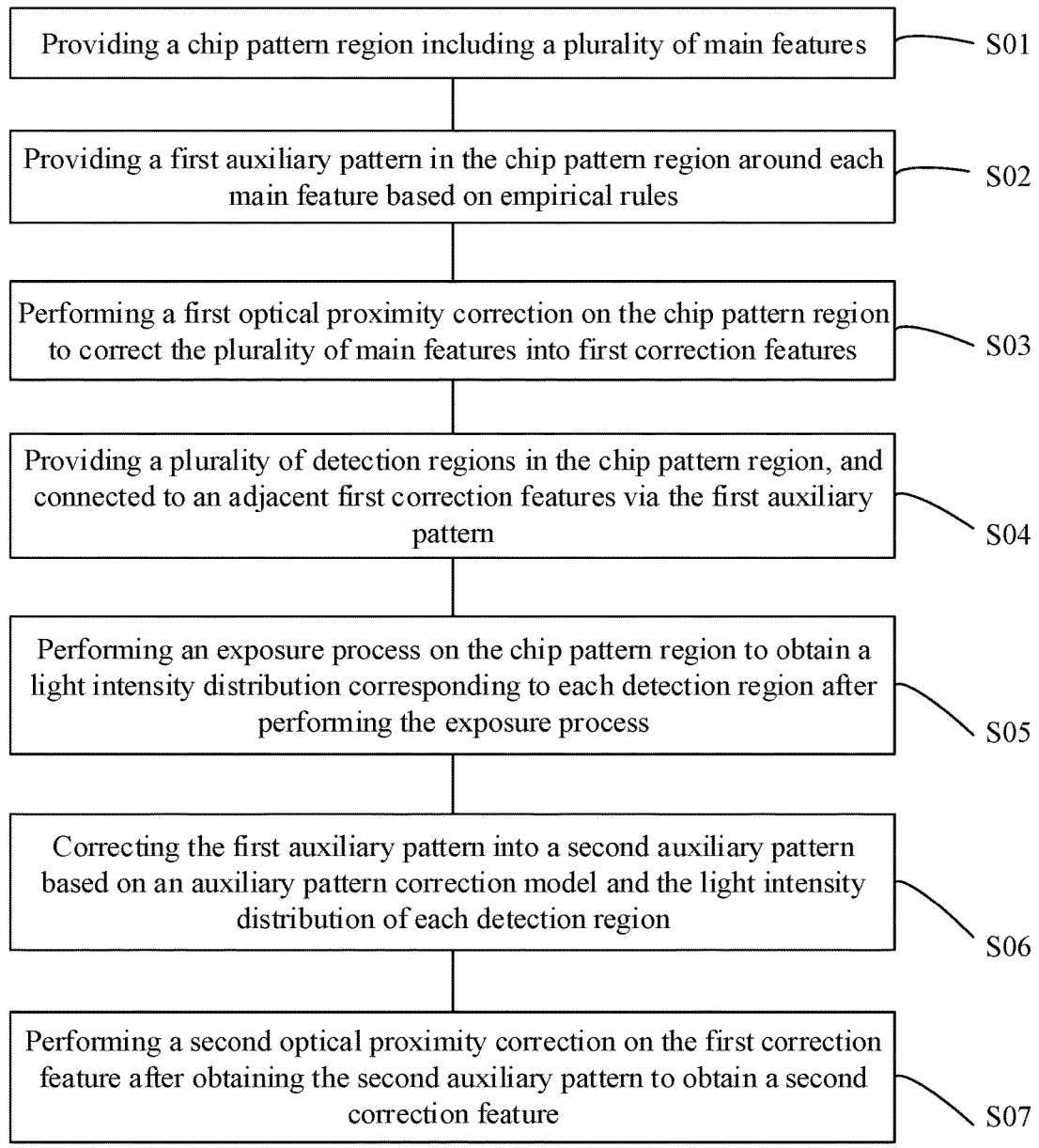
FIG. 1 illustrates an exemplary mask pattern correction method consistent with various disclosed embodiments of the present disclosure.

Reference will now be made in detail to exemplary embodiments of the disclosure, which are illustrated in the accompanying drawings. Wherever possible, the same reference numbers will be used throughout the drawings to refer to the same or the alike parts.

An exemplary method for providing scattering bars includes: providing optically corrected main features; inserting a plurality of scattering bars within a gap between the main features based on empirical rules, where each main feature is an exposable pattern and each scattering bar is a non-exposable pattern; and performing an optical proximity detection on the main features as well as the scattering bars after inserting the scattering bars.

The scattering bars are inserted between the main features, for example, based on the empirical rules. In other words, the plurality of scattering bars are inserted within the gap between the main features based on the empirical artificial preset configuration rules and in combination with the position and morphology of the gap between the main features as well as the number and corresponding positions of the scattering bars that need to be inserted. After providing the scattering bars, the position of each scattering bar with respect to the main features is detected. The position and size of each scattering bar is adjusted based the detection results, such that the pattern of each scattering bar is a non-exposable pattern. However, the sizes of the scattering bars provided around each main feature based on the empirical rules are uniform. Both the shapes of the main features and the distance between the adjacent main features in different regions are different. The main features in different regions have different degree of restriction on the sizes of the scattering bars that are non-exposable. Thus, when the sizes of the scattering bars are a fixed value, the scattering bars cannot be sufficiently determined based on the difference of the main features in different regions. For example, in a case where the scattering bars in the chip pattern region are a non-exposable pattern, the edges of the scattering bars in some regions are close to the edges of the main features to the greatest extent, while the edges of the scattering bars in some regions cannot be close to the edges of the main features to the greatest extent.

In some cases, to overcome the disadvantages of the scattering bars provided based on the empirical rules, a method for providing the scattering bars based on a model may be used, including, providing the main features on the whole chip; globally scanning the main features on the whole chip to obtain parameters of the main features on the whole chip; providing a preset model; calculating parameters of the scattering bars on the whole chip according to the obtained parameters of the main features on the whole chip based on the preset model; and inserting the scattering bars between the main features on the whole chip according to the calculated parameters of the scattering bars. The method for providing the scattering bars based on the model can determine the number, positions and widths of the scattering bars. The widths of the scattering bars provided around each main feature are determined, respectively, and the performance of the scattering bars is sufficiently utilized.

However, the algorithm of the preset model is complicated, and the method for providing the scattering bars based on the model needs to globally scan the main features on the whole chip and to calculate the parameters, thus a large amount of calculation cost and time are needed, such that the manufacturing cost greatly increases, and the promotion of industrialization is limited. In addition, the stability of the method for providing the scattering bars based on the model is poor. For example, the method for providing the scattering bars based on the model relies entirely on the model calculation and is lack of appropriate artificial preset configuration, a large number of defect points will be produced and, the difficulty for eliminating the defect points will increase.

The present disclosure provides a mask pattern correction method. FIG. 1 illustrates an exemplary mask pattern correction method consistent with various disclosed embodiments; and FIGS. 2-9 illustrate schematic diagrams corresponding to certain stages of the exemplary correction method.

Figure 2:
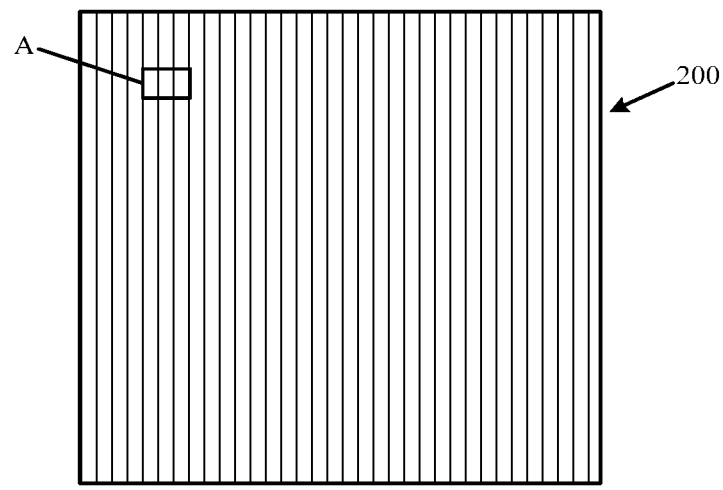
FIGS. 2-9 illustrate schematic diagrams corresponding to certain stages of an exemplary mask pattern correction method consistent with various disclosed embodiments of the present disclosure.
Figure 3:
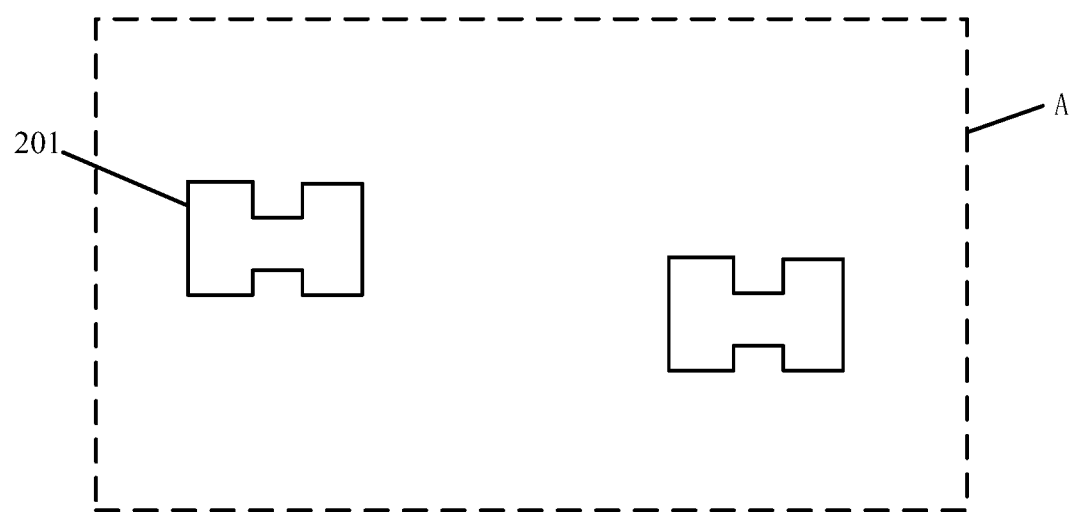

As shown in FIG. 1, at the beginning of the correction method, a chip pattern region including a plurality of main features may be provided (S01). FIGS. 2-3 illustrate a corresponding schematic diagram.

FIG. 3 illustrates an enlarged schematic of an area 'A' in FIG. 2. Referring to FIGS. 2-3, a chip pattern region 200 may be provided. The chip pattern region 200 may include a plurality of main features 201.

In one embodiment, the chip pattern region 200 may be used as a mask plate in a photolithography process for fabricating a chip. The photoresist on a wafer may be exposed by using the mask plate as a mask to form a photoresist pattern on each chip region on the wafer. The chip regions on the wafer may be etched by using the photoresist pattern as a mask to form gates, metal interconnection wires, conductive plugs and other semiconductor structures in the chip regions on the wafer.

The wafer may include a plurality of chip regions arranged in an array, and the adjacent chip regions may have cutting tracks. In one embodiment, the chip pattern region 200 may be used to form the photoresist pattern in a single chip region by an exposure process.

Each main feature 201 may be an exposable pattern, and may be used to define the photoresist pattern formed by the exposure process. The size of each main feature 201 may be larger than the resolution threshold of the photolithography process. In one embodiment, each main feature 201 may be in a bar shape.

The main features 201 may be patterns to be processed. To ensure that the size, position, and boundary morphology of the photoresist pattern formed by exposing the main features 201 are more accurate, an optical proximity correction may be performed on the main features.

Figure 4:
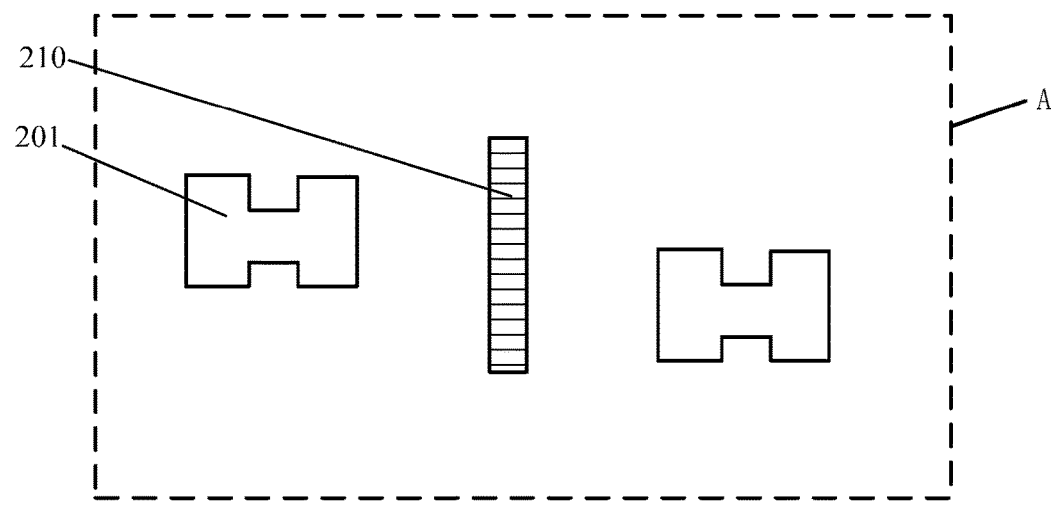

Returning to FIG. 1, after providing the main features, a first auxiliary pattern may be provided (S02). FIG. 4 illustrates a corresponding schematic diagram.

FIG. 4 illustrates a schematic diagram on the basis of FIG. 3. Referring to FIG. 4, one or more first auxiliary pattern 210 may be provided in the chip pattern region 200 around each main feature 201 based on empirical rules. The first auxiliary pattern 210 may be a non-exposable pattern, and the size of the first auxiliary pattern 210 may be smaller than the resolution threshold of the photolithography process. In one embodiment, the first auxiliary pattern 210 may include scattering bars.

In one embodiment, the empirical rules may be referred to preset configuration rules provided based on experience. One or more first auxiliary pattern 210 may be provided around each main feature 201 based on the preset configuration rules. The positions, the number and the sizes of the first auxiliary patterns 210 may be provided in combination with the position and morphology of a gap between the main features 201 in the process of actually providing the first auxiliary pattern 210. The first auxiliary pattern 210 may determine the number, the positions and the approximate sizes of subsequently provided second auxiliary patterns.

The adjacent main features 201 may be centrally symmetric with respect to the first auxiliary pattern 210 between the adjacent main features 201. In one embodiment, the number of the first auxiliary patterns 210 between the adjacent main features 201 is one or two as an example.

The sizes of the first auxiliary patterns 210 provided around each main feature according to the empirical rules may be uniform. The first auxiliary patterns 210 may be subsequently corrected to obtain the second auxiliary patterns, and the sizes of the second auxiliary patterns may be sufficiently determined.

Figure 5:
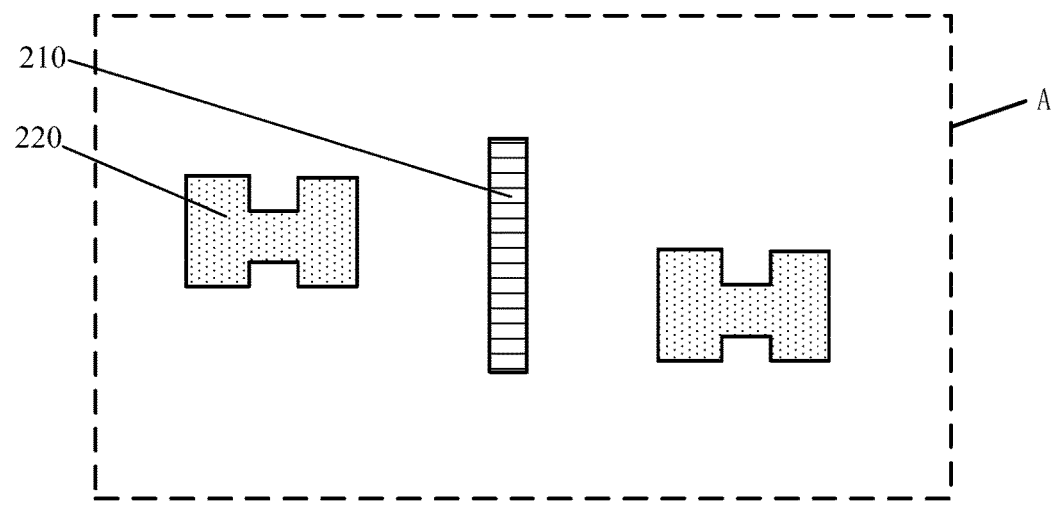

Returning to FIG. 1, after providing the first auxiliary patterns, a first optical proximity correction may be performed to form first correction features (S03). FIG. 5 illustrates a corresponding schematic diagram.

Referring to FIG. 5, after providing the first auxiliary patterns 210 in the chip pattern region 200 around each main feature 201 based on the empirical rules, a first optical proximity correction may be performed on the chip pattern region 200, such that the plurality of main features 201 (illustrated in FIG. 4) may be corrected into first correction features 220. The first optical proximity correction may be used to perform error correction on the plurality of main features 201.

Each main feature 201 may be an exposable pattern, thus each first correction feature 220 obtained after performing the first optical proximity correction may be an exposable pattern. The size of each first correction feature 220 may be larger than the resolution threshold of the photolithography process.

In one embodiment, the first optical proximity correction may include: obtaining size parameters of the main features 201 and the first auxiliary patterns 210; and performing a calculation through a first optical proximity correction model based on the size parameters of the main features 201 and the first auxiliary patterns 210 to obtain the first correction features 220.

In one embodiment, obtaining the first optical proximity correction model may include: obtaining a first exposure pattern by using a test mask made with the chip pattern region 200 to perform an exposure process; obtaining a first test data by measuring the size of the first exposure pattern; and establishing the first optical proximity correction model by comparing and fitting the first test data and the pattern data of the test mask.

The number of times of the first optical proximity correction may be in a range of approximately 5 times-10 times, including 5 times, 8 times, or 10 times, etc. The number of times of the first optical proximity correction may satisfy the requirements for performing the error correction on the plurality of main features 201 while enabling the number of times of the first optical proximity correction to be small.

Figure 6:
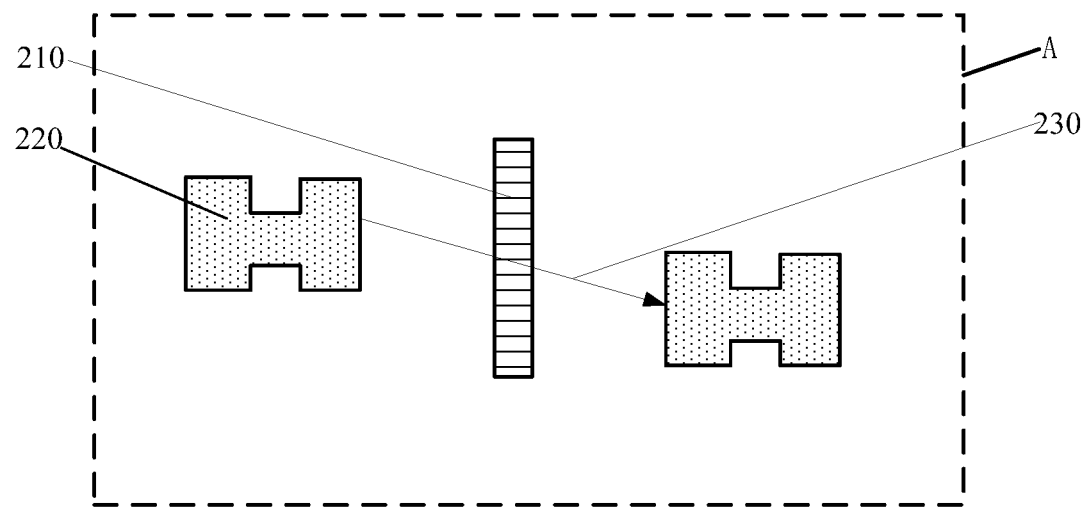

Returning to FIG. 1, after performing the first optical proximity correction, a plurality of detection regions may be provided (S04). FIG. 6 illustrates a corresponding schematic diagram.

Referring to FIG. 6, a plurality of detection regions 230 may be provided in the chip pattern region 200. Each detection region 230 may be connected to an adjacent first correction feature 220 via the first auxiliary pattern 210. Each detection region 230 may include one of a one-dimensional pattern and a two-dimensional pattern. In one embodiment, the detection region 230 may be a one-dimensional pattern. In other words, the detection region 230 may be a detection line.

When the detection region 230 is a two-dimensional pattern, each detection region 230 may be connected to an adjacent first correction feature 220 via entire the first auxiliary pattern 210 between the adjacent main features 201. In another embodiment, the detection region 230 may be connected to an adjacent first correction feature 220 via portions of the first auxiliary pattern 210 between the adjacent main features 201.

In one embodiment, each detection region 230 may be connected to an adjacent first correction feature 220 via a center of the first auxiliary pattern 210 between the adjacent first correction features 220. In one embodiment, the first auxiliary pattern 210 may have a rectangle shape, and a long side of the first auxiliary pattern 210 may face toward an adjacent first correction feature 220. Each detection region 230 may be connected to the adjacent first correction feature 220 via the long side of the first auxiliary pattern 210. Correspondingly, a subsequent second auxiliary pattern may have a rectangle shape.

Figure 7:
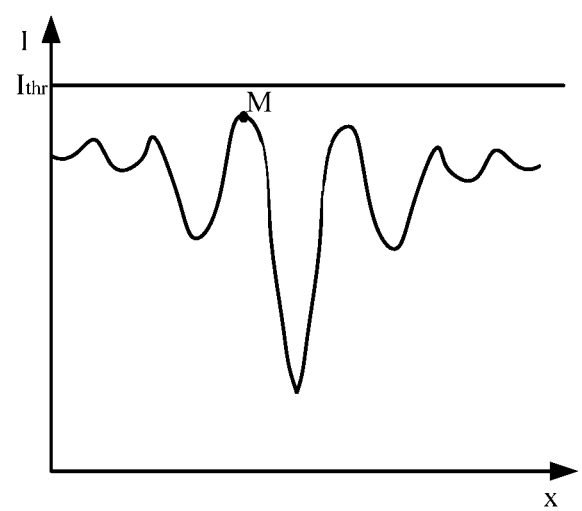

Returning to FIG. 1, after providing the plurality of detection regions, an exposure process may be performed (S05). FIG. 7 illustrates a corresponding schematic diagram.

Referring to FIG. 7, an exposure process may be performed on the chip pattern region 200 after performing the first optical proximity correction to obtain a light intensity distribution corresponding to each detection region 230 after performing the exposure process. In one embodiment, the exposure process may use parameters, e.g., wavelength of light, as used for the main features in a lithography process.

Obtaining the light intensity distribution corresponding to each detection region 230 after performing the exposure process may include: obtaining the light intensity corresponding to each detection region 230 after performing the exposure process; establishing a coordinate system for defining a relationship between the position of each detection region 230 and the light intensity of the corresponding each detection region 230; and obtaining a function of the light intensity of each detection region 230 after performing the exposure process and the position of corresponding each detection region 230 in the coordinate system.

In one embodiment, the detection region 230 is a detection line, and the exposure process is performed on the chip pattern region 200 to obtain the light intensity distribution corresponding to each detection region 230 after performing the exposure process as an example.

FIG. 7 illustrates the light intensity distribution of a certain detection region 230 after performing the exposure process on the chip pattern region 200 when the detection region 230 is a detection line. The used coordinate system may be a Cartesian coordinate system. The x-axis may represent the position of the detection line, and the unit of the position of the detection line is 'nm'. The y-axis may represent the light intensity value of the detection region 230, and the unit of the light intensity value is arbitrary.

The light intensity corresponding to 'M' in FIG. 7 in the coordinate system may be a threshold light intensity, $I_{thr}$. During the exposure process, when the photoresist is irradiated with light having a light intensity greater than or equal to the threshold light intensity, $I_{thr}$, the properties of the photoresist may be changed to form an exposure pattern in the photoresist. During the exposure process, when the photoresist is irradiated with light having a light intensity smaller than the threshold light intensity, $I_{thr}$, the properties of the photoresist may not be changed, and the exposure pattern may not be formed in the photoresist.

Figure 8:
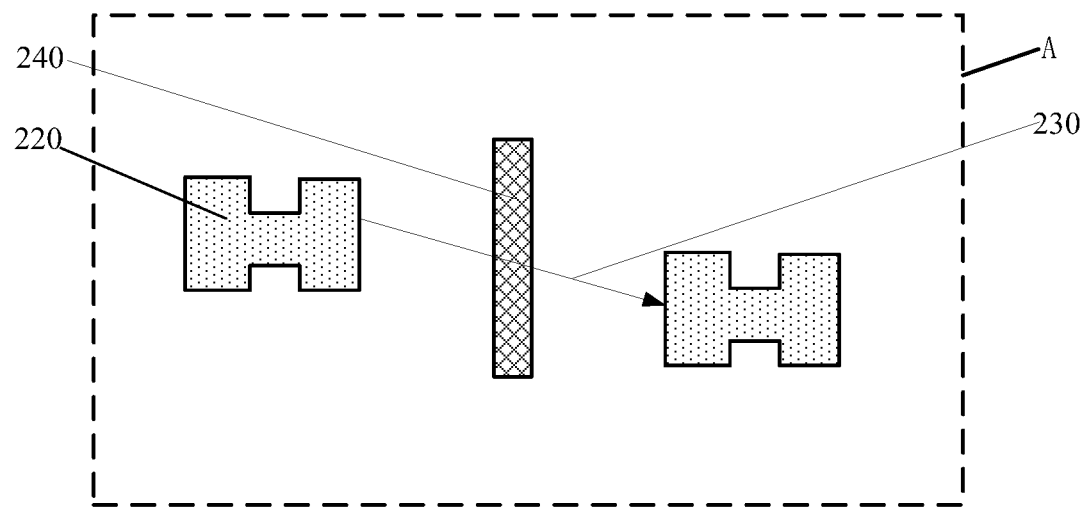

Returning to FIG. 1, after performing the exposure process, the first auxiliary pattern may be corrected into a second auxiliary pattern (S06). FIG. 8 illustrates a corresponding schematic diagram.

Referring to FIG. 8, the first auxiliary pattern 210 may be corrected into a second auxiliary pattern 240 based on an auxiliary pattern correction model and the light intensity distribution of each detection region 230.

In one embodiment, the second auxiliary pattern 240 may include scattering bars. The contrast of the exposure pattern may be enhanced and the boundary morphology of the exposure pattern may be improved by utilizing the interference and diffraction of the exposure light during the exposure process. The second auxiliary pattern 240 may be a non-exposable pattern, and the size of the second auxiliary pattern 240 may be smaller than the resolution threshold of the photolithography process.

Correcting the first auxiliary pattern 210 into the second auxiliary pattern 240 may include: obtaining a maximum value of the light intensity corresponding to each detection region 230 based on the obtained light intensity distribution of each detection region 230; obtaining a size of the second auxiliary pattern 240 through the auxiliary pattern correction model based on the maximum value of the light intensity corresponding to each detection region 230 and the size of the first auxiliary pattern 210; and providing the second auxiliary pattern 240 in the chip pattern region 200 around corresponding each first correction feature 220.

The auxiliary pattern correction model may include a first auxiliary pattern correction model and a second auxiliary pattern correction model. Correcting the first auxiliary pattern into the second auxiliary pattern may also include setting the threshold light intensity, $I_{thr}$.

Setting the threshold light intensity, $I_{thr}$, may include providing a test chip pattern region group. The test chip pattern region group may include a plurality of sequentially arranged test chip pattern regions. Each test chip pattern region may include adjacent test main features, and a distance between the adjacent test main features may be different in each test chip pattern region. The method may also include providing a test auxiliary pattern between the adjacent test main features in each test chip pattern region. In addition, the method may include performing an exposure process on each test chip pattern region to obtain a critical test chip pattern region. The critical test chip pattern region may be one of the test chip pattern regions. The distance between the adjacent test main features in the critical test chip pattern region may have a critical size. The critical size may be a minimum value of the distance between the adjacent test main features in the test chip pattern region that the test auxiliary pattern in the test chip pattern region is capable of being exposed when performing the exposure process on each test chip pattern region. Moreover, the method may include providing a test detection region in the critical test chip pattern region. The test detection region may be connected to an adjacent test main feature via the test auxiliary pattern. Further, the method may include performing a test exposure process on the critical test chip pattern region to obtain a light intensity distribution corresponding to the test detection region after performing the test exposure process; and setting the light intensity associated with the near emerging auxiliary pattern within the test detection region after performing the test exposure process as the threshold light intensity.

When the obtained maximum value of the light intensity corresponding to the detection region 230, $I_{peak}$, is smaller than the threshold light intensity, $I_{thr}$, a width of the second auxiliary pattern 240 may be larger than a width of the first auxiliary pattern 210. The difference between the width of the second auxiliary pattern 240 and the width of the first auxiliary pattern 210, $\Delta w$, may be obtained through the first auxiliary pattern correction model based on the maximum value of the light intensity corresponding to the detection region 230, $I_{peak}$, and the width of the first auxiliary pattern 210, $w_0$:

$$\Delta w = (I_{thr} - I_{peak}) \frac{1 \text{ nm}}{I_{peak}(w_0 + 1 \text{ nm}) - I_{peak}(w_0)}.$$

When the obtained maximum value of the light intensity corresponding to the detection region 230, $I_{peak}$, is larger than the threshold light intensity, $I_{thr}$, the width of the second auxiliary pattern 240 may be smaller than the width of the first auxiliary pattern 210. The difference between the width of the second auxiliary pattern 240 and the width of the first auxiliary pattern 210, $\Delta w$, may be obtained through the second auxiliary pattern correction model based on the maximum value of the light intensity corresponding to the detection region, $I_{peak}$, and the width of the first auxiliary pattern, $w_0$:

$$\Delta w = (I_{thr} - I_{peak}) \frac{1 \text{ nm}}{I_{peak}(w_0) - I_{peak}(w_0 - 1 \text{ nm})}.$$

The algorithm of both the first auxiliary pattern correction model and the second auxiliary pattern correction model may be simple, such that the correction process for the first auxiliary pattern 210 may be simple.

The first auxiliary pattern 210 may be provided in the chip pattern region 200 around each main feature 201 based on the empirical rules. The number, position and approximate size of the second auxiliary patterns 240 may be determined by the first auxiliary pattern 210. Through the auxiliary pattern correction model, the first auxiliary pattern 210 in each region may be respectively corrected into the second auxiliary pattern 240. The size of each second auxiliary pattern 240 may be sufficiently determined on the basis of the size of the first auxiliary pattern 210, respectively. The second auxiliary pattern 240 in the chip pattern region 200 may be a non-exposable pattern, and the size of each second auxiliary pattern 240 may be close to the resolution threshold of the photolithography process to the greatest extent on the basis of the adjacent main feature. In one embodiment, the difference between the resolution threshold of the photolithography process and the size of the second auxiliary pattern 240 may be in a range of approximately 3 nm-8 nm.

In addition, the second auxiliary pattern 240 may be obtained in combination with the empirical rules and the auxiliary pattern correction model, and may not entirely rely on the model calculation, thus the stability of the second auxiliary pattern 240 may be improved.

Figure 9:
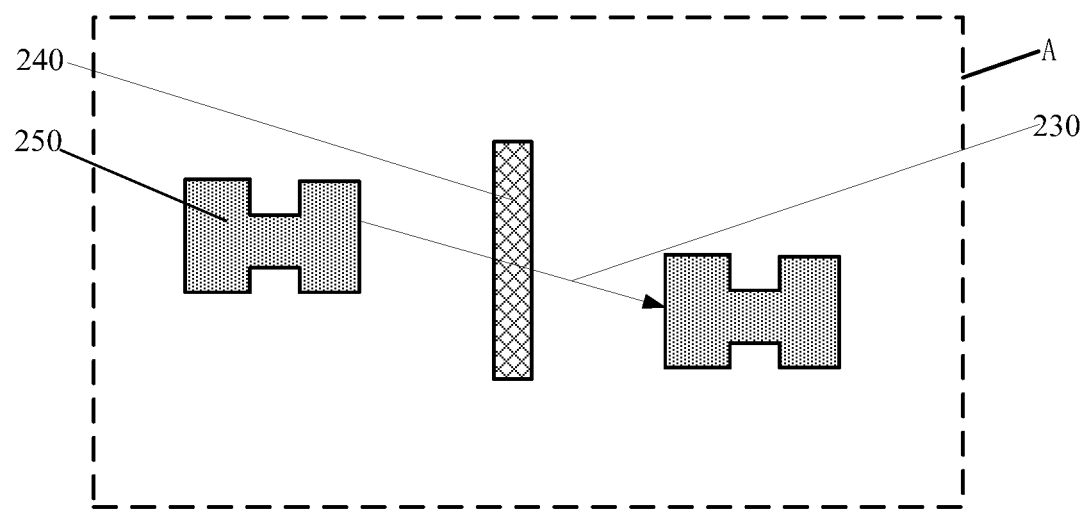

Returning to FIG. 1, after obtaining the second auxiliary pattern, a second optical proximity correction may be performed on the first correction feature to obtain a second correction feature (S07). FIG. 9 illustrates a corresponding schematic diagram.

Referring to FIG. 9, after obtaining the second auxiliary pattern 240, a second optical proximity correction may be performed on the first correction feature 220 (illustrated in FIG. 8) to obtain a second correction feature 250. The second correction feature 250 may be an exposable pattern. The size of the second correction feature 250 may be larger than the resolution threshold of the photolithography process. The second optical proximity correction may be used to perform an error correction on the first correction feature 220.

The number of times of the second optical proximity correction may be in a range of approximately 2 times-10 times, including 2 times, 5 times, 8 times, or 10 times, etc. The number of times of the second optical proximity correction may satisfy the requirements for performing the error correction on the first correction feature 220 while enabling the number of times of the second optical proximity correction to be small.

In the mask pattern correction method consistent with various disclosed embodiments, the first auxiliary pattern may be provided in the chip pattern region around each main feature, for example, based on the empirical rules. The number, position and approximate size of the second auxiliary patterns may be determined by the first auxiliary pattern. Through the auxiliary pattern correction model, the first auxiliary pattern in each region may be respectively corrected into the second auxiliary pattern. The size of each second auxiliary pattern may be sufficiently determined on the basis of the size of the first auxiliary pattern, respectively. The second auxiliary pattern in the chip pattern region may be a non-exposable pattern, and the edge of each second auxiliary pattern may be close to the edge of the first correction feature to the greatest extent, such that the size of each second auxiliary pattern may be close to the resolution threshold of the photolithography process to the greatest extent. In addition, the second auxiliary pattern may be obtained in combination with the empirical rules and the auxiliary pattern correction model, and may not entirely rely on the model calculation. Therefore, the mask pattern correction cost may be reduced, the mask pattern correction efficiency may be improved, and the stability of the second auxiliary pattern may be improved.

The mask pattern correction method consistent with various disclosed embodiments may be used to fabricate a mask for a photolithography process. The photolithography process may include an exposure process, a development process after the exposure process, and an etching process after the development process. In the exposure process, light may be irradiated onto the photoresist-coated silicon wafer through regions in the mask where light can pass through, and the photoresist may undergo chemical reactions under the irradiation of light. In the development process, a photolithographic pattern may be formed by using the difference in the degree of dissolution of the exposed and unexposed photoresist in the developer, thus the mask pattern may be transferred from the mask to the photoresist to form a patterned photoresist layer. In the etching process, the silicon wafer may be etched using the patterned photoresist layer as an etch mask to form structures corresponding to the mask pattern. The mask pattern may be further transferred from the patterned photoresist layer to the silicon wafer.

As the design size continues to decrease, the design size is getting closer to the limits of a photolithography imaging system. The diffraction effect of light that results in an optical image degradation on the design pattern and leads to seriously distorted photolithographic pattern from the mask pattern, which may be avoided by using the disclosed mask pattern correction method. Since the second auxiliary pattern around the main feature is determined using the mask pattern correction method in the present disclosure, the photolithography resolution may be improved, thus the photolithographic quality of the main feature may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the actual scope of the present disclosure.

What is claimed is:

1. A correction method for a mask pattern, comprising:
providing a chip pattern region, including a plurality of main features;
providing first auxiliary patterns, in the chip pattern region around each main feature;
performing a first optical proximity correction on the chip pattern region to correct the plurality of main features into first correction features;
providing a plurality of detection regions in the chip pattern region, wherein each detection region is connected to an adjacent first correction feature via the first auxiliary pattern;
performing an exposure process on the chip pattern region, to obtain a light intensity distribution corresponding to each detection region after performing the exposure process;
correcting the first auxiliary patterns into second auxiliary patterns based on an auxiliary pattern correction model and the light intensity distribution of each detection region; and
performing a second optical proximity correction on the first correction features after obtaining the second auxiliary patterns to obtain second correction features.

2. The method according to claim 1, wherein:
about one or two first auxiliary patterns are arranged between adjacent main features.

3. The method according to claim 1, wherein:
adjacent main features are centrally symmetric with respect to the first auxiliary pattern between the adjacent main features; and
each detection region is connected to an adjacent first correction feature via a center of the first auxiliary pattern between the adjacent first correction features.

4. The method according to claim 1, wherein:
each detection region includes one of a one-dimensional pattern and a two-dimensional pattern.

5. The method according to claim 1, wherein correcting the first auxiliary patterns into the second auxiliary patterns includes:
obtaining a maximum value of light intensity corresponding to each detection region based on the obtained light intensity distribution of each detection region;
obtaining a size of the second auxiliary pattern through the auxiliary pattern correction model based on the maximum value of the light intensity corresponding to each detection region and a size of the first auxiliary pattern; and
providing the second auxiliary pattern in the chip pattern region around corresponding each first correction feature.

6. The method according to claim 5, wherein:
the first auxiliary pattern has a rectangle shape;
a long side of the first auxiliary pattern faces toward an adjacent first correction feature;
each detection region is connected to the adjacent first correction feature via the long side of the first auxiliary pattern; and
the second auxiliary pattern has a rectangle shape.

7. The method according to claim 6, wherein:
the auxiliary pattern correction model includes a first auxiliary pattern correction model and a second auxiliary pattern correction model; and
correcting the first auxiliary patterns into the second auxiliary patterns includes setting a threshold light intensity.

8. The method according to claim 7, wherein:
when the obtained maximum value, $I_{peak}$, of the light intensity corresponding to the detection region is smaller than the threshold light intensity, $I_{thr}$,
a width of the second auxiliary pattern is larger than a width, $w_0$, of the first auxiliary pattern; and
a difference, $\Delta w$, between the width of the second auxiliary pattern and the width of the first auxiliary pattern is obtained through the first auxiliary pattern correction model based on the maximum value of the light intensity corresponding to the detection region and the width of the first auxiliary pattern:

$$\Delta w = (I_{thr} - I_{peak}) \frac{1 \text{ nm}}{I_{peak}(w_0 + 1 \text{ nm}) - I_{peak}(w_0)}.$$

9. The method according to claim 7, wherein:
when the obtained maximum value, $I_{peak}$, of the light intensity corresponding to the detection region is larger than the threshold light intensity, $I_{thr}$,
a width of the second auxiliary pattern is small than a width, $w_0$, of the first auxiliary pattern; and a difference, Δw, between the width of the second auxiliary pattern and the width of the first auxiliary pattern is obtained through the second auxiliary pattern correction model based on the maximum value of the light intensity corresponding to the detection region and the width of the first auxiliary pattern:

$$\Delta w = (I_{thr} - I_{peak}) \frac{1 \text{ nm}}{I_{peak}(w_0) - I_{peak}(w_0 - 1 \text{ nm})}.$$

10. The method according to claim 7, wherein setting the threshold light intensity includes:
proving a test chip pattern region group, wherein the test chip pattern region group includes a plurality of sequentially arranged test chip pattern regions, each test chip pattern region includes adjacent test main features, and a distance between the adjacent test main features in each test chip pattern region is different;
providing a test auxiliary pattern between the adjacent test main features in each test chip pattern region;
performing an exposure process on each test chip pattern region to obtain a critical test chip pattern region, wherein the critical test chip pattern region is one of the test chip pattern regions, the distance between the adjacent test main features in the critical test chip pattern region has a critical size, and the critical size is a minimum value of the distance between the adjacent test main features in the test chip pattern region that the test auxiliary pattern in the test chip pattern region is capable of being exposed when performing the exposure process on each test chip pattern region;
providing a test detection region in the critical test chip pattern region, wherein the test detection region is connected to an adjacent test main feature via the test auxiliary pattern;
performing a test exposure process on the critical test chip pattern region to obtain a light intensity distribution corresponding to the test detection region after performing the test exposure process; and
setting a light intensity associated with the near emerging auxiliary pattern within the test detection region after performing the test exposure process as the threshold light intensity.

11. The method according to claim 1, wherein obtaining the light intensity distribution corresponding to each detection region after performing the exposure process includes:
obtaining a light intensity corresponding to each detection region after performing the exposure process;
establishing a coordinate system for defining a relationship between a position of each detection region and the light intensity of the corresponding each detection region; and
obtaining a function of the light intensity of each detection region after performing the exposure process and the position of corresponding each detection region in the coordinate system.

12. The method according to claim 1, wherein:
a size of the first correction feature is larger than a resolution threshold of the photolithography process; and
a size of the second correction feature is larger than the resolution threshold of the photolithography process.

13. The method according to claim 1, wherein:
a size of the first auxiliary pattern is smaller than a resolution threshold of the photolithography process; and
a size of the second auxiliary pattern is smaller than the resolution threshold of the photolithography process.

14. The method according to claim 13, wherein:
a difference between the resolution threshold of the photolithography process and the size of the second auxiliary pattern is in a range of approximately 3 nm-8 nm.

15. The method according to claim 1, wherein:
the number of times of the first optical proximity correction is in a range of approximately 5 times-10 times;
the number of times of the second optical proximity correction is in a range of approximately 2 times-10 times;
the first optical proximity correction is used to perform an error correction on the main features; and
the second optical proximity correction is used to perform an error correction on the first correction features.

16. The method according to claim 1, wherein:
the first auxiliary pattern includes scattering bars; and
the second auxiliary pattern includes the scattering bars.

17. The method according to claim 1, wherein the first optical proximity correction includes:
obtaining size parameters of the main features and the first auxiliary patterns; and
performing a calculation through a first optical proximity correction model based on the size parameters of the main features and the first auxiliary patterns to obtain the first correction features.

18. The method according to claim 17, wherein obtaining the first optical proximity correction model includes:
obtaining a first exposure pattern by using a test mask made with the chip pattern region to perform an exposure process;
measuring a size of the first exposure pattern to obtain a first test data; and
establishing the first optical proximity correction model by comparing and fitting the first test data and a pattern data of the test mask.

19. The method according to claim 1, wherein:
each main feature is an exposable pattern;
each first auxiliary pattern is a non-exposable pattern; and
each second auxiliary pattern is a non-exposable pattern.

20. The method according to claim 1, wherein:
the number, position and approximate size of the second auxiliary patterns are determined by the first auxiliary patterns.

* * * * *